United States Patent
Nagao

(10) Patent No.: US 7,216,790 B2
(45) Date of Patent: May 15, 2007

(54) COMPONENT FEEDING APPARATUS

(75) Inventor: Kazuhiro Nagao, Kuzuu-machi (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 0 days.

(21) Appl. No.: 10/696,579

(22) Filed: Oct. 30, 2003

(65) Prior Publication Data

US 2004/0140338 A1 Jul. 22, 2004

(30) Foreign Application Priority Data

Oct. 31, 2002 (JP) ........................... 2002-317811

(51) Int. Cl.
*B65H 20/00* (2006.01)
*G03H 1/24* (2006.01)

(52) U.S. Cl. .................. 226/132; 226/76; 226/128; 226/129; 226/157

(58) Field of Classification Search ............. 226/76, 226/128, 129, 132, 135, 157
See application file for complete search history.

(56) References Cited

U.S. PATENT DOCUMENTS

| | | | | |
|---|---|---|---|---|
| 2,139,339 A | * | 12/1938 | Vaughan et al. ............. 225/16 |
| 3,035,763 A | * | 5/1962 | Morris ......................... 234/128 |
| 3,329,325 A | * | 7/1967 | Clark et al. .................... 226/51 |
| 5,294,035 A | * | 3/1994 | Asai et al. .................... 226/157 |
| 6,082,603 A | * | 7/2000 | Takada et al. ............... 226/157 |

FOREIGN PATENT DOCUMENTS

JP  07-283596  10/1995

* cited by examiner

*Primary Examiner*—Kathy Matecki
*Assistant Examiner*—Evan Langdon
(74) *Attorney, Agent, or Firm*—Morrison & Foerster LLP

(57) ABSTRACT

In a component feeding apparatus, forwarding pitches of the storage tape are reduced without using an alternative forwarding gear corresponding to the reduced pitches. The component feeding apparatus feeds chip components by intermittently forwarding the storage tape having the chip components by predetermined pitches. Thy apparatus has a sprocket for intermittently forwarding the storage tape, a forwarding gear supported by the same axis as that of the sprocket and rotating together with the sprocket, a forwarding lever turnably supported, and first and second forwarding pawls both attached to the forwarding lever. Every time the forwarding lever turns in a predetermined direction, the first forwarding pawl and the second forwarding pawl engage with the forwarding gear alternately to rotate the forwarding gear by half a tooth pitch.

7 Claims, 4 Drawing Sheets

COMPONENT FEEDING APPARATUS

BACKGROUND OF THE INVENTION

1. Field of the Invention:

The invention relates to a component feeding apparatus for feeding electronic components to a pick-up position by intermittently forwarding a storage tape storing the electronic components at predetermined pitches.

2. Description of the Related Art:

In a conventional component feeding apparatus, a storage tape is intermittently forwarded by predetermined pitches by using a forwarding gear corresponding to storing pitches of components in the storage tape (for example, Japanese Patent Application Publication No. Hei 7-283596). When changing the pitches for forwarding the storage tape, it is necessary to change a connecting position of a link for controlling a forwarding operation of the storage tape or replace mechanical elements such as the link and a forwarding gear. For example, for intermittently forwarding the storage tape of 2 mm storing pitches by 2 mm pitches, a forwarding gear having teeth, which corresponds to 2 mm forwarding pitch, is used. For intermittently forwarding the storage tape of 1 mm storing pitches by 1 mm pitch, a forwarding gear having teeth, which corresponds to 1 mm forwarding pitch, is used.

However, it is difficult and impractical to form a forwarding gear having teeth corresponding to 1 mm forwarding pitch, since the durability of such a miniature gear is low and manufacturing costs are high.

SUMMARY OF THE INVENTION

The invention provides a component feeding apparatus for feeding electronic components to a pick-up position by intermittently forwarding a storage tape storing the electronic components therein by a forwarding pitch that is adjustable. The apparatus includes a sprocket supported rotatably around a rotation axis and intermittently forwarding the storage tape, a forwarding gear supported rotatably around the rotation axis, a forwarding lever supported rotatably around the rotation axis, and a first forwarding pawl and a second forwarding pawl which are attached to the forwarding lever. The first and second forwarding pawls are configured to engage with the forward gear alternatively upon a rotational movement of the forwarding lever in a predetermined direction so that each of the rotational movements of the forwarding lever generates a rotation of the forward gear by a half tooth pitch.

The invention also provides a component feeding apparatus for feeding electronic components to a pick-up position by intermittently forwarding a storage tape storing the electronic components therein by a forwarding pitch that is adjustable. The apparatus includes a sprocket supported rotatably around a rotation axis and intermittently forwarding the storage tape, a forwarding gear supported rotatably around the rotation axis, a forwarding lever supported rotatably around the rotation axis, and a plurality of forwarding pawls attached to the forwarding lever. The forwarding pawls are configured to engage with the forward gear in turn upon a rotational movement of the forwarding lever in a predetermined direction so that each of the rotational movements of the forwarding lever generates a rotation of the forward gear by a pitch of a tooth divided by a total number of the forwarding pawls.

DETAILED DESCRIPTION OF THE INVENTION

Figure 1:
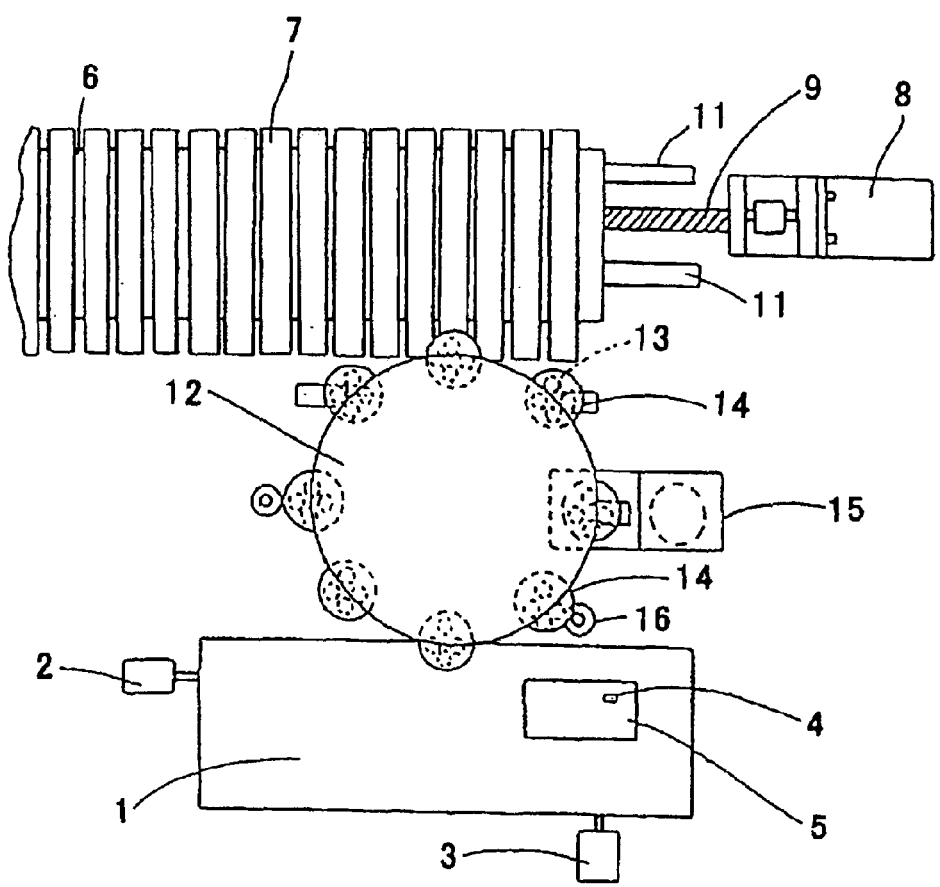
FIG. 1 is a plan view of a component mounting apparatus of an embodiment of this invention.
Figure 2:
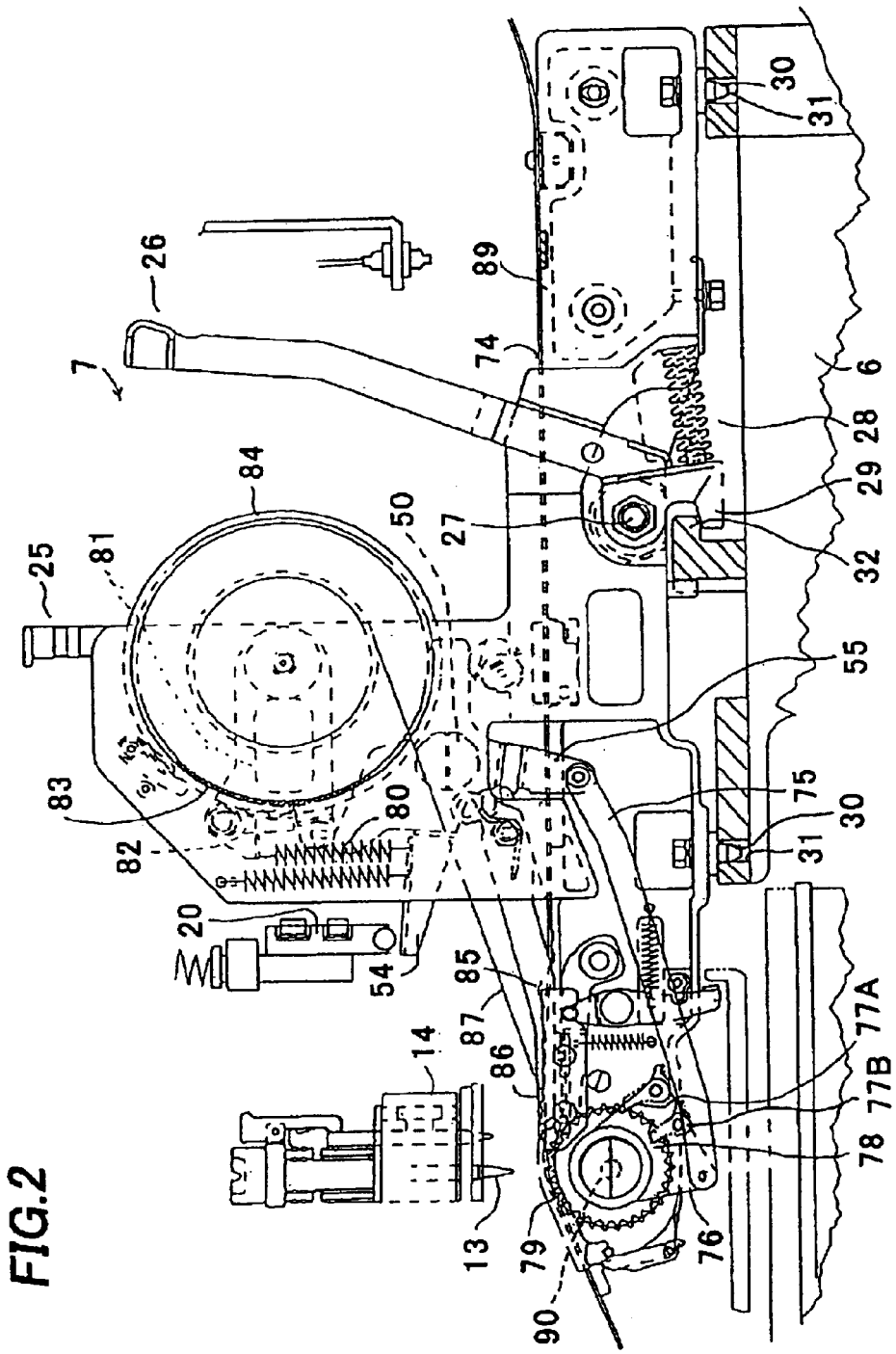
FIG. 2 is a side view of the component mounting apparatus of FIG. 1 mounted with a component feeding apparatus.

An embodiment of a component feeding apparatus of the invention will be described with reference to the drawings. FIGS. 1 and 2 show a component mounting apparatus using the component feeding apparatus of the embodiment. The component mounting apparatus has an XY table 1 to receive a printed board 5 which is to be mounted with an electronic chip component 4 (hereafter, referred to as a "chip component"). This XY table 1 is movable in X and Y directions by rotation of an X axis motor 2 and a Y axis motor 3, respectively. The component mounting apparatus further has a feeding stage 6 provided with many component feeding apparatuses 7 for feeding the chip components 4. A nut (not shown) is fixed to this feeding stage 6 and a ball screw 9 is screwed therein. When the ball screw 9 rotates driven by a feeding stage drive motor 8, the feeding stage 6 moves in the X direction along linear guides 11 through the nut screwed with the ball screw 9.

Furthermore, the component mounting apparatus has a turntable 12. The turntable 12 is intermittently rotatable by rotation of a cam (not shown) driven by a drive motor (not shown). There are eight mounting heads 14 disposed on an outer edge of a lower surface of the turntable 12 at equal pitches corresponding to pitches of the intermittent rotation of the turntable 12. The mounting head 14 has four suction nozzles 13 for picking the chip components 4 up by suction.

Each of the mounting heads 14 is attached to a lower part of a head shifting shaft (not shown), which is provided piercing through the turntable 12 and vertically movable. The mounting head 14 moves upward and downward by vertical shifting of the head shifting shaft driven by a vertical movement drive source (not shown).

The suction nozzles 13 provided in the mounting head 14 pick the chip components 4 up from the component feeding apparatus 7.

A position where the mounting head 14 stops for the suction nozzles 13 to pick the chip components 4 up by suction is a pick-up station. The suction nozzle 13 picks the chip component 4 up at the pick-up station. A next position where the mounting head 14 stops is a recognition station. A component camera 15 takes an image of the chip component 4 attached to the suction nozzle 13 at this recognition station. A recognition processing device recognizes a shift amount of a position of the chip component 4 based on the taken image.

A next position where the mounting head 14 stops after the recognition station is an angle adjustment station. At this angle adjustment station, a nozzle rotation roller 16 adjusts a rotation angle of the chip component 4 by the shift amount by rotating the suction nozzle 13 in a θ direction based on a recognition result extracted by a recognition processing device.

A next position where the mounting head 14 stops after the angle adjustment station is a mounting station. The chip component 4 attached to the suction nozzle 13 stopping there is mounted on the printed board 5 set on the XY table 1 at this mounting station.

A rotation amount of the cam, which is described above, is controlled by a cam positioner. The cam positioner detects rotation angles of the specified cam, and a control (not shown) device receiving detecting signals sends a command of starting each of various operations to each of devices.

A vertical shift bar 20 is provided above the component feeding apparatus 7 which moves by moving of the feeding stage 6 and stops at a position where the chip component 4 is picked up. The vertical shift bar 20 moves upward and downward by a vertical movement apparatus (not shown). A component feeding operation of the component feeding apparatus 7 is performed by vertical shifting of the vertical shift bar 20.

The component feeding apparatus 7 is detachably attached on the feeding stage 6. The attachment process is as follows. First, an operator grips a hold portion 25 and a turning lever 26 shown (FIG. 2), and turns the turning lever 26 around an axis 27 resisting a spring force of a spring 28 to rotate an engagement portion 29 on a tip of the turning lever 26 counterclockwise in FIG. 2. In this state, attachment pins 30 provided on front and back portions of a lower part of the component feeding apparatus 7 are inserted in an attachment hole 31 formed in the feeding stage 6. After the attachment pins 30 are inserted in the attachment hole 31 like this, an operator returns the turning lever 26 to an original position by utilizing the spring force of the spring 28 to engage the engagement portion 29 with a receive portion 32, thereby completing attachment of the component feeding apparatus 7 to the feeding stage 6.

The component feeding apparatus 7 has a turning lever 54 rotatably supported by a support axis 50 as a center axis. Although the turning lever 54 is being pulled in a clockwise direction by a pulling spring 80, as the above-described vertical shift bar 20 descends, the turning lever 54 turns counterclockwise resisting the pulling force of the pulling spring 80 in FIG. 2. The turning lever 54 is connected to a transfer drive piece 55, and an end of the transfer drive piece 55 is rotatably connected with one end of a transfer lever 75. Another end of the transfer lever 75 is rotatably connected with a forwarding lever 76, and the forwarding lever 76 is supported by a fixing axis 90 turnably therearound.

When the vertical shift bar 20 lowers to rotate the turning lever 54 counterclockwise, this counterclockwise rotation is transferred to the transfer lever 75 through the transfer drive piece 55. The motion of the transfer lever 75 is transferred to the forwarding lever 76, and the forwarding lever 76 turns counterclockwise around the fixing axis 90 as a center axis.

The forwarding lever 76 is provided with a first forwarding pawl 77A and a second forwarding pawl 77B. The first and second forwarding pawls 77A and 77B are provided in a position where those can be alternately engaged with a forwarding gear 78 by turning the forwarding lever 76 counterclockwise in FIG. 2. The forwarding gear 78 is rotatably attached around the fixing axis 90 as a center axis. A disk-shaped sprocket 79 is fixed to the forwarding gear 78 and also rotates with the forwarding gear 78 around the fixing axis 90 as a center axis.

As the forwarding lever 76 turns counterclockwise, the forwarding pawls 77A and 77B alternately rotates the forwarding gear 78 counterclockwise by half a tooth pitch. That is, when the vertical shift bar 20 lowers to turn the turning lever 54 counterclockwise in FIG. 2 and also turn the forwarding lever 76 counterclockwise, either one of the two forwarding pawls 77A and 77B, for example, the first forwarding pawl 77A rotates the forwarding gear 78 counterclockwise by half a tooth pitch. Then, the vertical shift bar 20 rises up to turn the forwarding lever 76 clockwise. When the vertical shift bar 20 lowers next time, the second forwarding pawl 77B rotates the forwarding gear 78 counterclockwise by half a tooth pitch. That is, two strokes of the vertical shift bar 20 rotate the forwarding gear 78 by a tooth pitch.

Figure 3A:
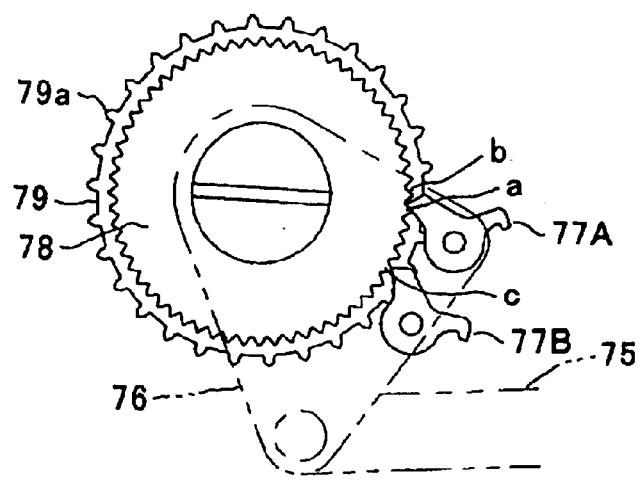
FIGS. 3A, 3B and 3C show rotations of a forwarding gear by a first forwarding pawl in the component feeding apparatus of FIG. 1.
Figure 3B:
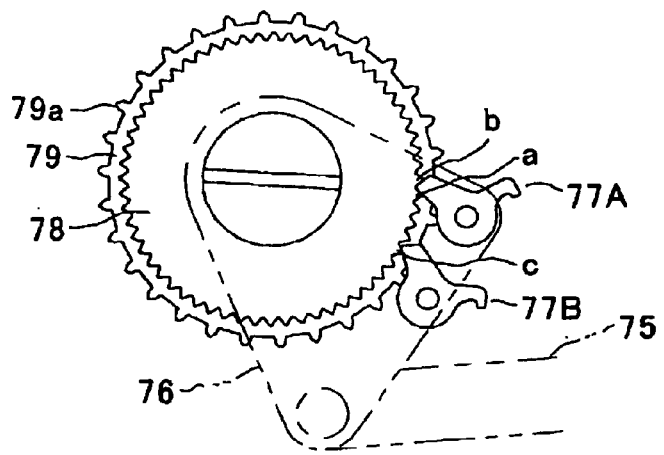
Figure 3C:
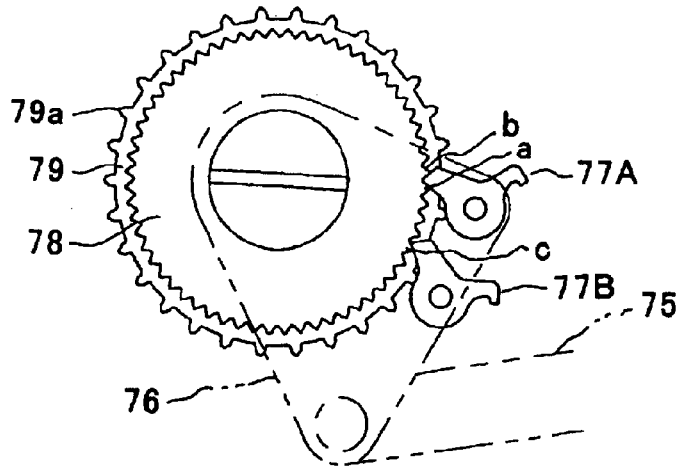

The above-described operation will be described in detail with reference to FIGS. 3A, 3B, 3C, 4A, 4B, and 4C. FIGS. 3A, 3B, and 3C are views showing a state where the forwarding lever 76 rotates counterclockwise and the first forwarding pawl 77A rotates the forwarding gear 78 counterclockwise by half a tooth pitch. A tip of the first forwarding pawl 77A is being pulled in a counterclockwise direction by a spring (not shown) and in contact with a tooth a of the forwarding gear 78 (FIG. 3A). When the forwarding lever 76 turns counterclockwise from this state, the first forwarding pawl 77A becomes in contact with a tooth b of the forwarding gear 78 and rotates the forwarding gear 78 counterclockwise (FIGS. 3B and 3C). At this point, the second forwarding pawl 77B is only in contact with a tooth c of the forwarding gear 78, being pulled in a counterclockwise direction by a spring (not shown). That is, by one counterclockwise turning of the forwarding lever 76, the first forwarding pawl 77A rotates the forwarding gear 78 counterclockwise by half a tooth pitch.

Figure 4A:
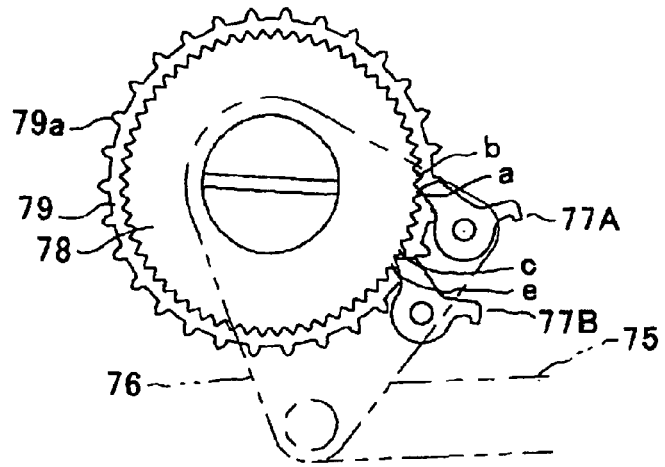
FIGS. 4A, 4B, and 4C show rotations of the forwarding gear by a second forwarding pawl in the component feeding apparatus of FIG. 1.
Figure 4B:
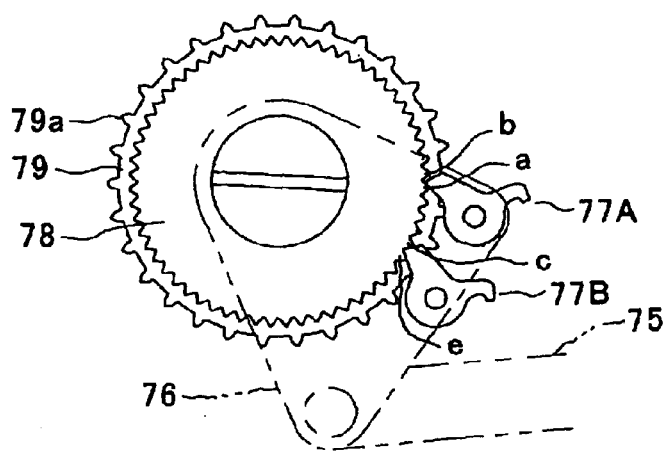
Figure 4C:
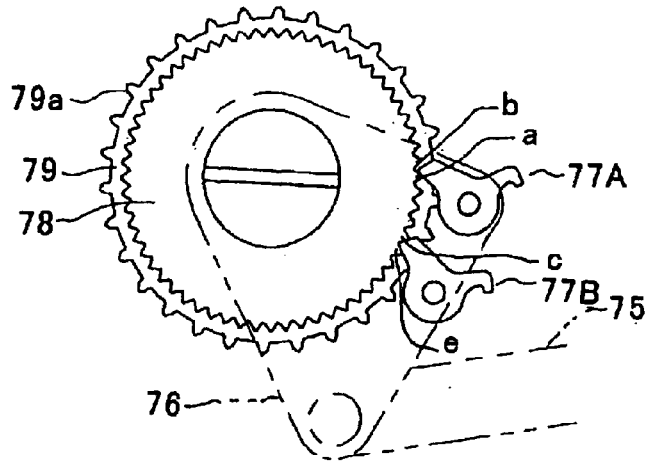

FIGS. 4A, 4B, and 4C are views showing a state where the forwarding lever 76 turns counterclockwise again and the second forwarding pawl 77B rotates the forwarding gear 78 counterclockwise by another half a tooth pitch. After the forwarding gear 78 rotates counterclockwise by half a tooth pitch in FIGS. 3A, 3B, and 3C as described above, the forwarding lever 76 turns clockwise to make a tip of the second forwarding pawl 77B in contact with a tooth e over the tooth c of the forwarding gear 78 (FIG. 4A). Then, as the forwarding lever 76 turns counterclockwise next in FIG. 4A, the second forwarding pawl 77B becomes in contact with the tooth c of the forwarding gear 78 and rotates the forwarding gear 78 counterclockwise (FIGS. 4B and 4C). At this point, too, by one counterclockwise turning of the forwarding lever 76, the second forwarding pawl 77B rotates the forwarding gear 78 counterclockwise by half a tooth pitch in FIG. 4.

As described above, by two turning movements of the forwarding lever 76, the forwarding gear 78 rotates counterclockwise by a tooth pitch, as shown in FIGS. 3A, 3B, 3C, 4A, 4B, and 4C.

This half a tooth pitch rotation of the forwarding gear 78 by one counterclockwise turning of the forwarding lever 76 is achieved by adjusting an amount of the decent of the vertical shift bar 20, a length of the transfer drive piece 55 or the transfer lever 75, and a connecting position between the transfer drive piece 55 and the transfer lever 75. Furthermore, the forwarding gear 78 is engaged with a anti-reverse pawl (not shown), so that the forwarding gear 78 does not rotate clockwise in FIG. 2.

When the forwarding gear 78 intermittently rotates counterclockwise by half a tooth pitch around the fixing axis 90 in FIG. 2 as described above, the sprocket 79 integrally fixed to the forwarding gear 78 also intermittently rotates counterclockwise around the fixing axis 90.

Forwarding pins 79a are formed on a circumference edge of the sprocket 79 at predetermined pitches. The forwarding pins 79a can be inserted in forwarding holes (not shown)

formed at predetermined pitches on the storage tape 74 of predetermined storing pitches conveyed on a chute 89. As the sprocket 79 rotates intermittently, the forwarding pins 79a inserted in the forwarding holes convey the storage tape 74 by a predetermined pitch to feed the chip components stored in the storage tape 74 to a pick-up position of the suction nozzle 13.

In the above-described structure, even if the teeth of the forwarding gear 78 are formed at 2 mm pitches, there is no need to change the forwarding gear 78 for the storage tape of 1 mm storing pitches but half a tooth pitch rotation of the forwarding gear 78 can intermittently forward the storage tape of 1 mm storing pitch by 1 mm pitches. Therefore, although it is difficult to form the forwarding gear having teeth corresponding to the storage tape of 1 mm storing pitch, the forwarding gear having teeth at 2 mm pitches can be employed for the storage tape of 1 mm storing pitches.

Furthermore, when the turning lever 54 turns counterclockwise in FIG. 2, a ratchet lever 81 turns counterclockwise through the pulling spring 80. The ratchet pawl 82 is engaged with a ratchet gear 83 so that a cover tape reel 84 rotates counterclockwise by a predetermined angle in FIG. 2. As the cover tape reel 84 rotates, a cover tape 87 pasted on the storage tape 74 is peeled off the storage tape 74 at an opening 86 of a suppressor 85 pressing the storage tape 74 and wound around the cover tape reel 84.

Operation of the component pick-up apparatus provided with the above-described component feeding apparatus 7 will be described.

When an automatic operation starts by operating an operation portion (not shown) in the component mounting apparatus, a feeding stage drive motor 8 rotates and the feeding stage 6 moves along the linear guides 11 in order to move the component feeding apparatus 7 to a pick-up position of the suction nozzle 13 waiting at the pick-up station through the ball screw 9 and the nut, the component feeding apparatus 7 feeding the target chip component 4 specified in mounting data stored in a storage device (not shown).

Then, when the component feeding apparatus 7 stops at the pick-up position of the suction nozzle 13, the vertical shift bar 20 lowers to be in contact with the turning lever 54, and turn the turning lever 54 counterclockwise in FIG. 2. As the turning lever 54 turns counterclockwise by lowering of the vertical shift bar 20, the transfer drive piece 55 drives the transfer lever 75 and the transfer lever 75 turns the forwarding lever 76 counterclockwise in FIG. 2. When the forwarding lever 76 turns counterclockwise, either one of the forwarding pawls 77A and 77B rotates the forwarding gear 78 by half a tooth pitch. As the forwarding gear 78 rotates, the sprocket 79 rotates to forward the storage tape 74 by a predetermined pitch and to feed the chip component 4 to the pick-up position of the suction nozzle 13.

As the turning lever 54 rotates counterclockwise in FIG. 2, the ratchet lever 81 turns counterclockwise though the pulling spring 80. The ratchet pawl 82 is engaged with the ratchet gear 83 and rotates the cover tape reel 84 counterclockwise by a predetermined angle in FIG. 2. As the cover tape reel 84 rotates, the cover tape 87 pasted on the storage tape 74 is peeled off the storage tape 74 at the opening 86 of the suppressor 85 pressing the storage tape 74 and wound around the cover tape reel 84.

The chip component 4 picked up by the suction nozzle 13 at the pick-up station is moved to the recognition station by intermittent rotation of the turn table 12, the recognition camera 15 takes an image of the chip component 4 there, and the recognition processing device recognizes a shift amount of the position of the chip component 4. The nozzle rotation roller 16 adjusts an angle by the shift amount at the angle adjustment station to set the chip component 4 at a proper angle by moving it in the θ direction specified in data (not shown).

Next, the printed board 5, which is specified in the data, is set at a proper position aligned by the shift amount in the X and Y directions by rotation of the X axis motor 2 and the Y axis motor 3 of the XY table 1. The chip component 4 is mounted on this printed board 5 by descending of the suction nozzle 13 at the mounting station. Then, the chip components are sequentially mounted on the printed board 5 similarly.

Three or more forwarding pawls can be provided on the forwarding lever 76 at equal pitches. In this case, by each turning movement of the forwarding lever, each of the forwarding pawls is engaged with the forwarding gear 78 in turn so that the forwarding gear 78 rotates by one n-th of a tooth pitch ("n" means the total number of the forwarding pawls, e.g., one-third of a tooth pitch when provided with three pawls). Thus, the storages tapes of smaller pitches, for example less than 1 mm, my be used without changing the forwarding gear 78.

Although particular embodiments of the invention have been disclosed in detail, it will be recognized that variations or modifications of the disclosed apparatus, including the rearrangement of parts, are possible and those are included within the scope of the invention.

What is claimed is:

1. A component feeding apparatus for feeding electronic components to a pick-up position by intermittently forwarding a storage tape storing the electronic components therein by a forwarding pitch that is adjustable, comprising:

a sprocket supported rotatably around a rotation axis and intermittently forwarding the storage tape;

a forwarding gear supported rotatably around the rotation axis;

a forwarding lever supported rotatably; and a first forwarding pawl and a second forwarding pawl which are attached to the forwarding lever, wherein the first and second forwarding pawls are configured to engage with and drive the forwarding gear alternatively upon a rotational movement of the forwarding lever in a predetermined direction so that each of the rotational movements of the forwarding lever generates a rotation of the forwarding gear by a half tooth pitch of the forwarding gear.

2. The component feeding apparatus of claim 1, wherein the rotation of the forwarding gear by the half tooth pitch corresponds to a forwarding pitch of the storage tape, and two rotations of the forwarding gear by the half tooth pitch correspond to another forwarding pitch of the storage tape.

3. The component feeding apparatus of claim 1, wherein the forwarding lever is supported rotatably around the rotation axis.

4. A component feeding apparatus for feeding electronic components to a pick-up position by intermittently forwarding a storage tape storing the electronic components therein by a forwarding pitch that is adjustable, comprising:

a sprocket supported rotatably around a rotation axis and intermittently forwarding the storage tape;

a forwarding gear supported rotatably around the rotation axis;

a forwarding lever supported rotatably; and a plurality of forwarding pawls attached to the forwarding lever, wherein the forwarding pawls are configured to engage with and drive the forwarding gear in turn upon a rotational movement of the forwarding lever in a predetermined direction so that each of the rotational movements of the forwarding lever generates a rotation of the forwarding gear by a pitch of a tooth of the forwarding gear divided by a total number of the forwarding pawls.

5. The component feeding apparatus of claim 4, wherein the rotation of the forwarding gear by said pitch of the tooth divided by a total number of the forwarding pawls corresponds to a forwarding pitch of the adjustable forwarding pitches.

6. The component feeding apparatus of claim 4, wherein the forwarding lever is supported rotatably around the rotation axis.

7. A component feeding apparatus for feeding electronic components to a pick-up position by intermittently forwarding a storage tape storing the electronic components therein by a forwarding pitch that is adjustable, comprising:

a sprocket configured to rotate around a center of an axis;

a forwarding gear configured to rotate with the sprocket;

a forwarding lever configured to make a rotational movement; and a plurality of forwarding pawls attached to the forwarding lever, wherein the forwarding pawls are configured to engage with and drive the forwarding gear in turn upon the rotational movement of the forwarding lever so that each of the rotational movements of the forwarding lever generates a rotation of the forward gear by a pitch of a tooth of the forwarding gear divided by a total number of the forwarding pawls.

* * * * *